United States Patent
Kanda

(10) Patent No.: US 8,253,502 B2
(45) Date of Patent: Aug. 28, 2012

(54) SPREAD SPECTRUM CLOCK GENERATOR AND SEMICONDUCTOR DEVICE

(75) Inventor: Yoshinori Kanda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 119 days.

(21) Appl. No.: 12/801,205

(22) Filed: May 27, 2010

(65) Prior Publication Data

US 2010/0315172 A1  Dec. 16, 2010

(30) Foreign Application Priority Data

Jun. 11, 2009 (JP) ................................. 2009-140235

(51) Int. Cl.
*H03B 29/00* (2006.01)
(52) U.S. Cl. .............. 331/78; 331/34; 331/16; 327/117; 327/156; 327/159; 375/130
(58) Field of Classification Search .................... 331/16, 331/34, 78; 327/156, 159; 375/376
See application file for complete search history.

(56) References Cited

U.S. PATENT DOCUMENTS

| 5,488,627 A | 1/1996 | Hardin et al. ................. 375/139 |
| 7,443,324 B1 * | 10/2008 | Muhammad .................. 341/131 |

* cited by examiner

*Primary Examiner* — Arnold Kinkead
(74) *Attorney, Agent, or Firm* — McGinn IP Law Group, LLC

(57) ABSTRACT

A spread spectrum clock generator includes a voltage-controlled oscillator generating an operation clock, a feedback control unit, a modulated pulse generation unit generating a pulse signal obtained by performing a delta-sigma modulation on a component fluctuating a frequency of the operation clock, a level set unit setting an amplitude of the pulse signal, an adder adding a voltage generated by the feedback control unit and the pulse signal whose amplitude is set by the level set unit, and a low pass filter filtering a signal outputted from the adder and generating a control voltage applied to the voltage-controlled oscillator. The feedback control unit compares a phase of the operation clock with a phase of a reference clock, and based on results of the comparison, generates a voltage used as a reference to oscillate the voltage-controlled oscillator.

20 Claims, 11 Drawing Sheets

SPREAD SPECTRUM CLOCK GENERATOR AND SEMICONDUCTOR DEVICE

CROSS-REFERENCE TO RELATED APPLICATION

This application is based upon and claims the benefit of the priority of Japanese patent application No. 2009-140235 filed on Jun. 11, 2009, the disclosure of which is incorporated herein in its entirety by reference thereto.

TECHNICAL FIELD

The present invention relates to a spread spectrum clock generator (SSCG), and in particular, to an SSCG spreading the spectrum of an operation clock used in a semiconductor device.

BACKGROUND

As operating frequencies of large-scale integration (LSI) circuits improve, the importance of addressing electromagnetic interference (EMI) is growing. An SSCG phase-locked loop (PLL) is often included in digital consumer devices such as printers and personal computers, as measures against EMI. However, since an internal clock of an LSI circuit has a certain frequency, the spectrum exhibits a peak at a certain frequency, thereby causing radiated electromagnetic noise. By slightly changing such clock frequency with an SSCG, energy of the spectrum can be distributed to other frequencies and the peak at such certain frequency can therefore be reduced.

Patent Document 1 discloses a conventional SSCG, and FIG. 8 is a block diagram of a conventional SSCG disclosed in FIG. 6 of Patent Document 1. The clock generator of FIG. 8 includes programmable counters (or frequency dividers) 35 and 42 on the reference clock side and the feedback loop side, respectively. The clock generator changes the frequency of an operation clock by changing a frequency division ratio of the programmable counters 35 and 42 in the feedback loop in the PLL. The frequency division ratios of the programmable counters 35 and 42 are set by lookup tables 46 and 47, respectively. By changing the frequency division ratios of the programmable counters 35 and 42 with the lookup tables 46 and 47 during a PLL operation, the spectrum of a clock outputted from a voltage-controlled oscillator (VCO) is spread.

FIG. 9 is a block diagram of another conventional SSCG disclosed in FIG. 7 of Patent Document 1. Based on this clock generator, an analog modulation circuit 52 generates a waveform for modulation, which is added to a control voltage applied to a second VCO 51, to spread the spectrum of a clock outputted from the second VCO 51. The analog modulation circuit 52 uses a triangular waveform generator and a log anti-log amplifier to generate the waveform for modulation. Based on the clock generator of FIG. 9, a phase detector 37 compares phases, and a filter 38 smoothes the comparison results. The modulation voltage generated by the analog modulation circuit 52 is added to the output from the filter 38 to supply the control voltage to the second VCO 51.

Further, FIG. 10 is a block diagram of still another conventional SSCG disclosed in FIG. 8 of Patent Document 1. In FIG. 10, a reference clock oscillation circuit 72 including an LC circuit is used, and an oscillation frequency of the reference clock oscillation circuit 72 is directly modulated by the analog modulation circuit 52.

Furthermore, FIG. 11 is still another conventional SSCG disclosed in FIG. 9 of Patent Document 1. In FIG. 11, instead of the analog modulation circuit 52 of FIG. 9, a read only memory (ROM) 82 and a digital-to-analog converter 83 are used to generate a modulation waveform. The modulation waveform is added to a control voltage outputted from the filter 38 to modulate an oscillation frequency of the second VCO 51. As in the SSCG in FIG. 11, after the phase detector 37 compares phases and the filter 38 smoothes the comparison results, the output from the filter 38 is added to the modulation voltage outputted from the digital-to-analog converter 83.

Patent Document 1: U.S. Pat. No. 5,488,627

SUMMARY

The entire disclosure of the above patent document is incorporated herein by reference thereto. Analysis will be hereinafter made based on the present invention. In order to change a frequency division ratio in a PLL as in FIG. 8, a circuit for changing the frequency division ratio is required. Further, if the frequency of a reference clock is modulated as in FIG. 10, the reference frequency itself is shifted, resulting in possible undesirable effects. Furthermore, if the analog modulation circuit is used as in FIG. 9, the SSCG is easily affected by analog-circuit characteristic variation, and it is not easy to obtain arbitrary modulation characteristics. If the digital-to-analog converter is used as in FIG. 11, relatively stable characteristics can be obtained and a clock generator having arbitrary modulation characteristics can be obtained. However, a large-sized circuit is required to improve the modulation accuracy. This phrase is much to be described in the art.

According to a first aspect of the present invention there is provided an SSCG, which includes: a VCO generating an operation clock; a feedback control unit comparing a phase of the operation clock with a phase of a reference clock, and based on results of the comparison, generating a voltage used as a reference to oscillate the VCO; a modulated pulse generation unit generating a pulse signal obtained by performing a delta-sigma modulation on a component fluctuating a frequency of the operation clock; a level set unit setting an amplitude of the pulse signal; an adder adding a voltage generated by the feedback control unit and the pulse signal whose amplitude is set by the level set unit; and a low pass filter filtering a signal outputted from the adder and generating a control voltage applied to the VCO.

According to a second aspect of the present invention there is provided an SSCG, which includes: a VCO generating an operation clock; a feedback control unit comparing a phase of the operation clock with a phase of a reference clock, and based on results of the comparison, generating a voltage used as a reference to oscillate the VCO; a pulse generation unit generating a pulse signal; a level set unit setting an amplitude of the pulse signal; an adder adding a voltage generated by the feedback control unit and the pulse signal whose amplitude is set by the level set unit; and a low pass filter filtering a signal outputted from the adder and generating a control voltage applied to the voltage-controlled oscillator, wherein an oscillation frequency of the operation clock is fluctuated based on the pulse signal generated by the pulse generation unit.

In addition, according to a third aspect of the present invention there is provided a semiconductor device, which includes an SSCG and a clock synchronization circuit operating in synchronization with an operation clock. The SSCG includes: a VCO generating the operation clock, a feedback control unit comparing a phase of the operation clock with a phase of a reference clock, and based on results of the comparison, generating a voltage used as a reference to oscillate the VCO, a level set unit receiving a pulse signal obtained by performing a delta-sigma modulation on a component fluctuating a frequency of the operation clock and setting an amplitude of the pulse signal, an adder adding a voltage generated by the feedback control unit and the pulse signal whose amplitude is set by the level set unit, and a low pass filter filtering a signal outputted from the adder and generating a control voltage applied to the VCO.

The meritorious effects of the present invention are summarized as follows.

According to the present invention, by using a relatively simple configuration, an SSCG that is less susceptible to circuit characteristic variation and that has arbitrary modulation characteristics can be obtained.

PREFERRED MODES

Figure 1:
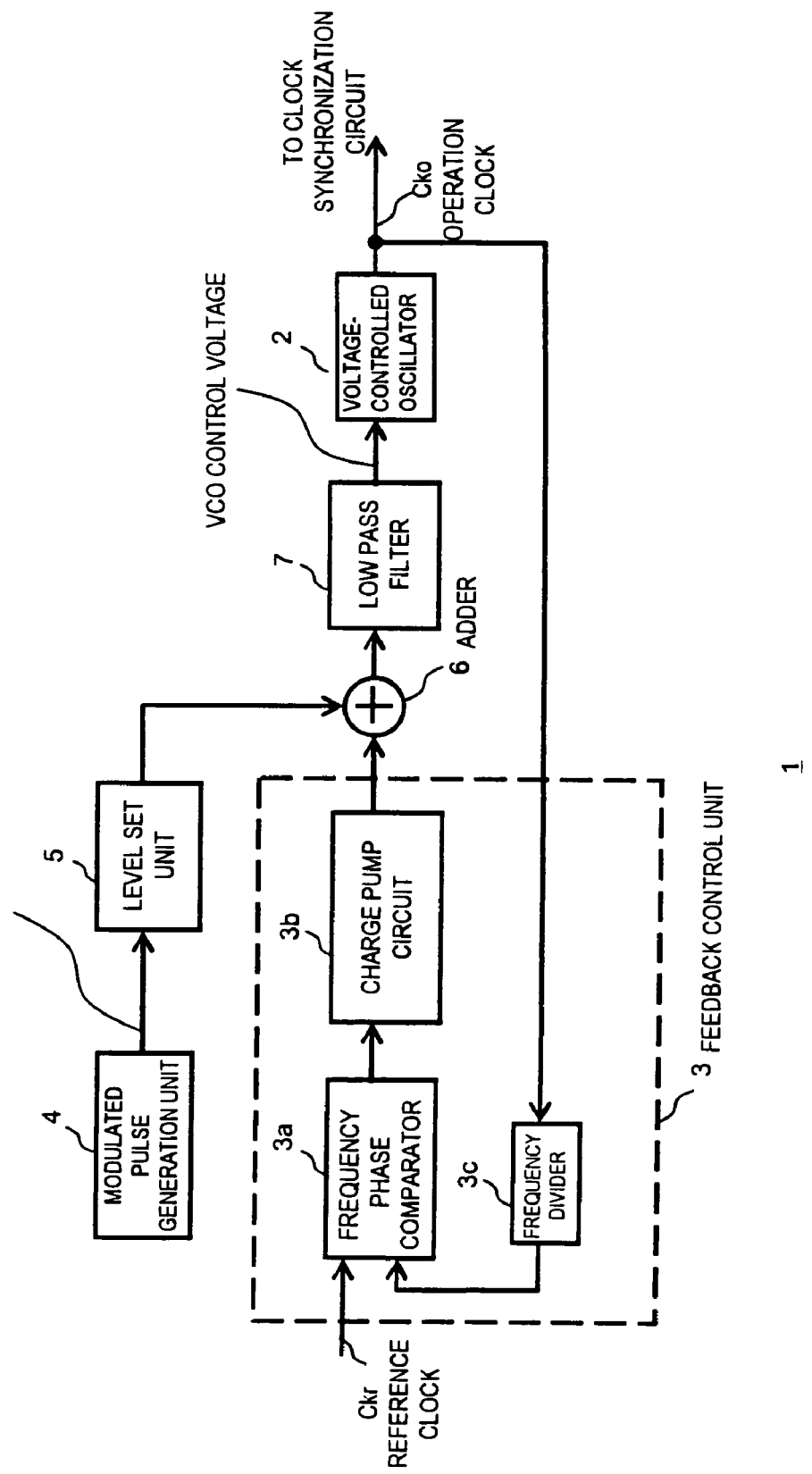
FIG. 1 illustrates a block diagram of an SSCG according to example 1 of the present invention.

First, an outline of the present invention will be described with reference to the accompanying drawings as needed. The drawings and reference characters referred to in the outline of the present invention are used to illustrate examples of the exemplary embodiments. Therefore, the drawings and reference characters do not limit variations of the exemplary embodiments according to the present invention.

Figure 4:
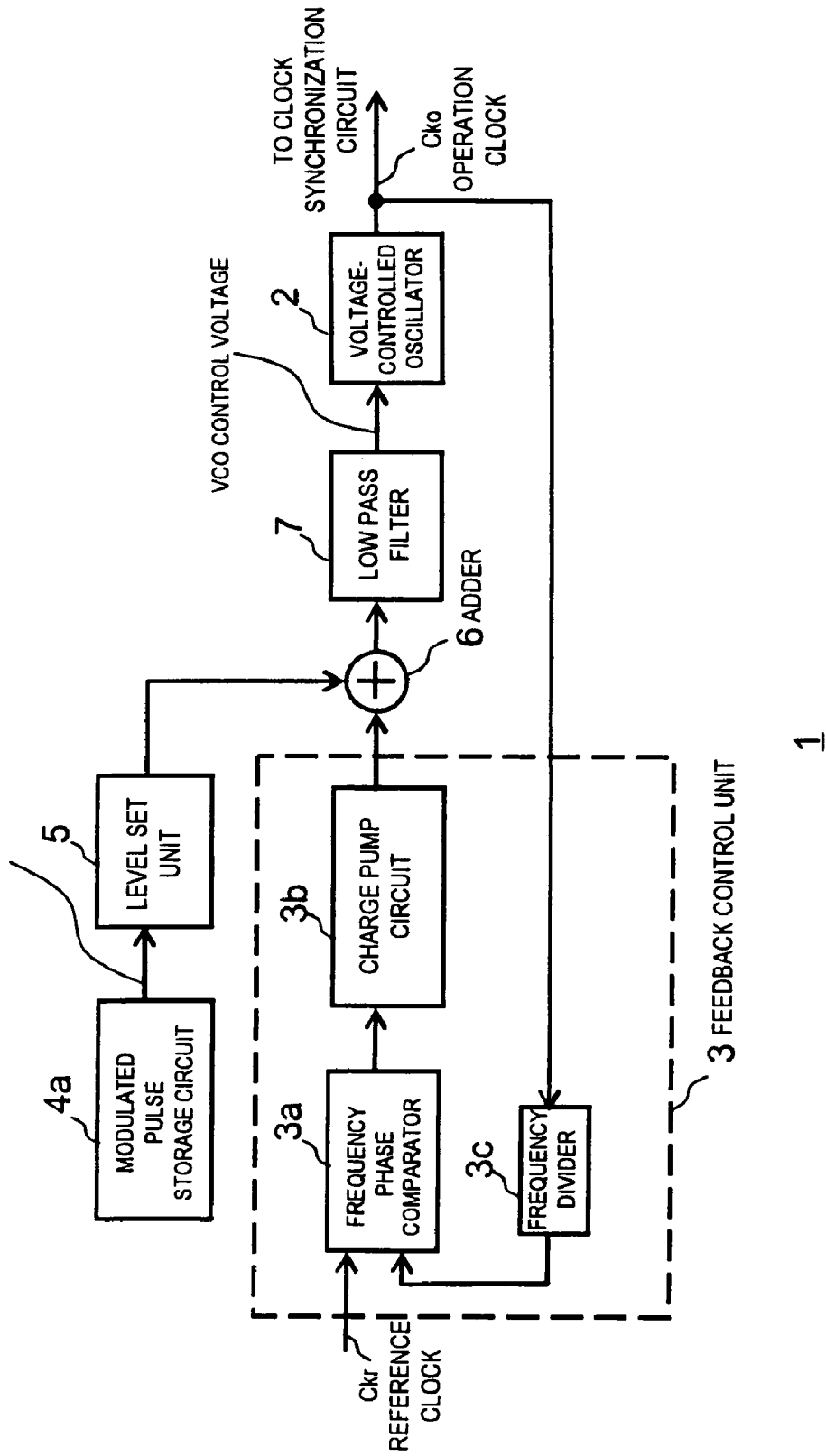
FIG. 4 illustrates a block diagram of an SSCG according to example 2 of the present invention.
Figure 5:
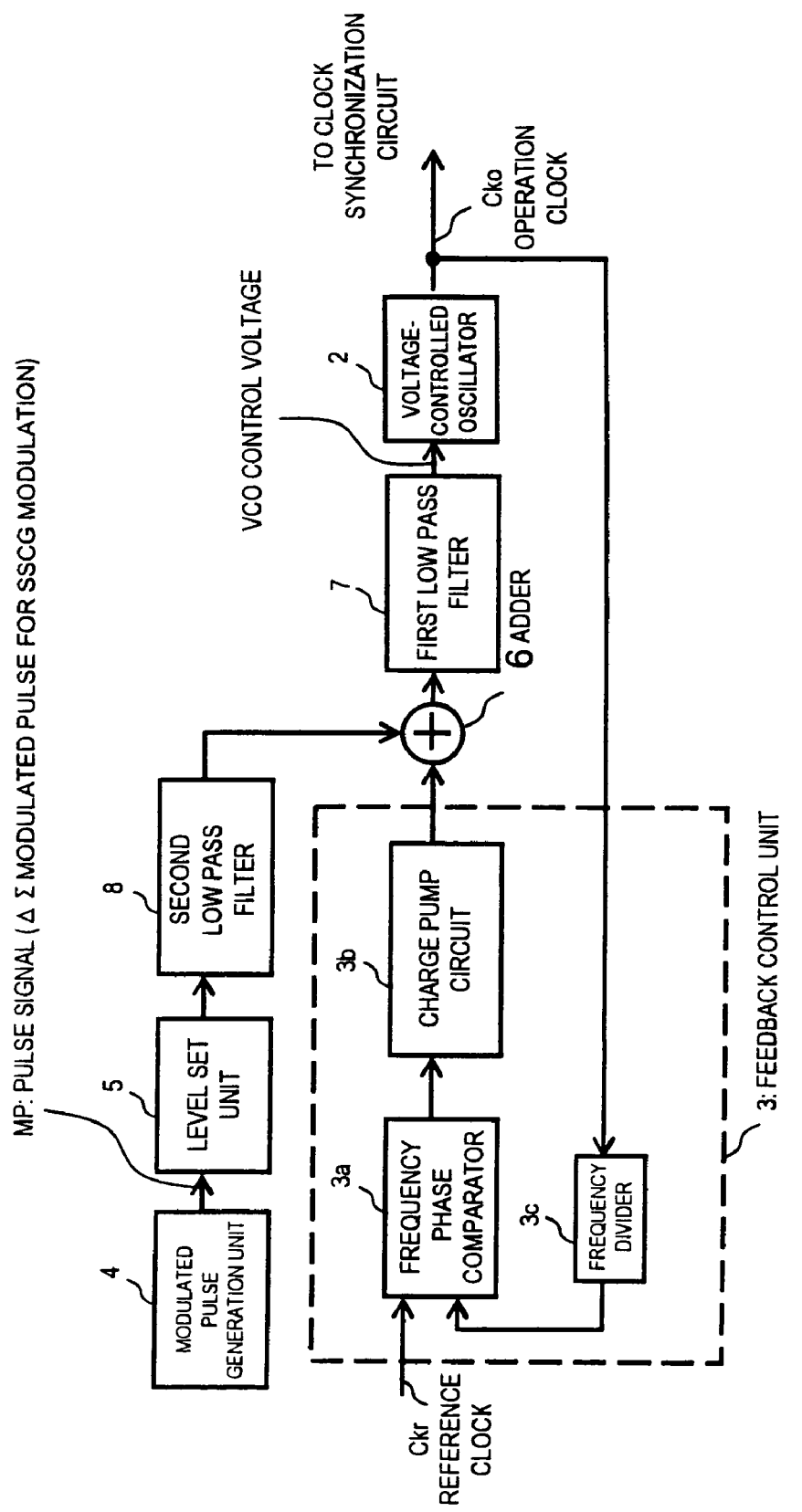
FIG. 5 illustrates a block diagram of an SSCG according to example 3 of the present invention.
Figure 6:
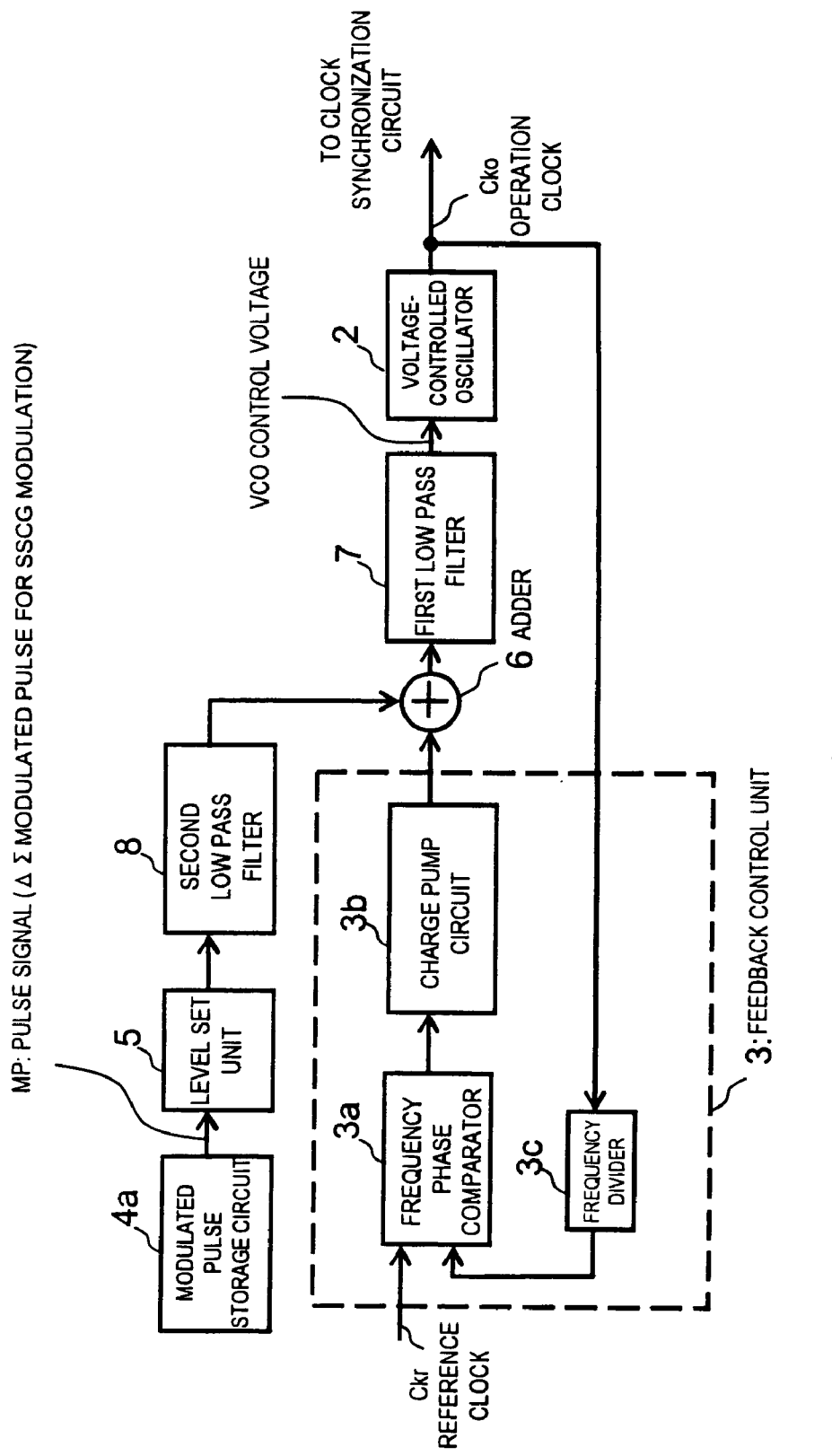
FIG. 6 illustrates a block diagram of an SSCG according to example 4 of the present invention.

As illustrated in FIGS. 1 and 4 to 6, an SSCG 1 of the present invention includes: a VCO 2 generating an operation clock Cko; a feedback control unit 3 comparing a phase of the operation clock Cko with a phase of a reference clock Ckr, and based on results of the comparison, generating a voltage used as a reference to oscillate the VCO 2; a modulated pulse generation unit (4, 4a) generating a pulse signal obtained by performing a delta-sigma modulation on a component fluctuating a frequency of the operation clock Cko; a level set unit 5 setting an amplitude of the pulse signal; an adder 6 adding a voltage generated by the feedback control unit 3 and the pulse signal whose amplitude is set by the level set unit 5; and a low pass filter 7 filtering a signal outputted from the adder 6 and generating a control voltage applied to the VCO 2. Based on this configuration, the low pass filter 7 demodulates the delta-sigma-modulated frequency change component into the control voltage to spread a spectrum, and the control voltage is applied to the VCO 2. Thus, compared with when a general digital-to-analog converter is used, the circuit size can be reduced. Further, since a delta-sigma-modulated pulse is used, by using a digital circuit or the like, a clock generator having arbitrary frequency characteristics can be obtained relatively easily. While a feedback control system of the PLL requires a low pass filter, the low pass filter 7 can be used to demodulate the delta-sigma-modulated signal and smooth the feedback control voltage. Further, it is preferable that the delta sigma modulation is performed depending on frequency characteristics of the low pass filter 7. Regarding the modulated pulse from the modulated pulse generation unit (4, 4a), for example, as illustrated in FIGS. 4 and 6, a desired pulse signal may be previously stored in the modulated pulse storage circuit 4a. Alternatively, a hardware or software module may be used to carry out digital signal processing to generate a desired pulse signal. The modulated pulse generation unit 4 may be arranged outside a semiconductor chip including the VCO 2. Furthermore, the level set unit 5 can set the level of frequency fluctuation.

Further, the pulse signal is obtained by performing a pulse density modulation on a component fluctuating a frequency of the operation clock. Thus, a delta-sigma modulation can be performed so that arbitrary frequency characteristics can be obtained by digital processing. An arbitrary signal may be used, as long as a desired frequency fluctuation component can be obtained after the low pass filter 7 performs integration and demodulation. Namely, an arbitrary signal may be used, as long as a desired frequency fluctuation component can be obtained after the signal passes through the low pass filter 7.

Further, as illustrated in FIGS. 5 and 6, the SSCG includes, assuming that the low pass filter is a first low pass filter 7, a second low pass filter 8 filtering a pulse signal whose amplitude is set by the level set unit 5. The adder 6 adds a voltage generated by the feedback control unit 3 and a pulse signal filtered by the second low pass filter 8. In this way, the delta-sigma-modulated frequency fluctuation component is demodulated by the second low pass filter 8 and the first low pass filter 7. By arranging the second low pass filter 8 in addition to the first low pass filter 7, characteristics of the low pass filter in the PLL feedback control system and those of the low pass filter used to demodulate the frequency fluctuation component can be changed.

Figure 7:
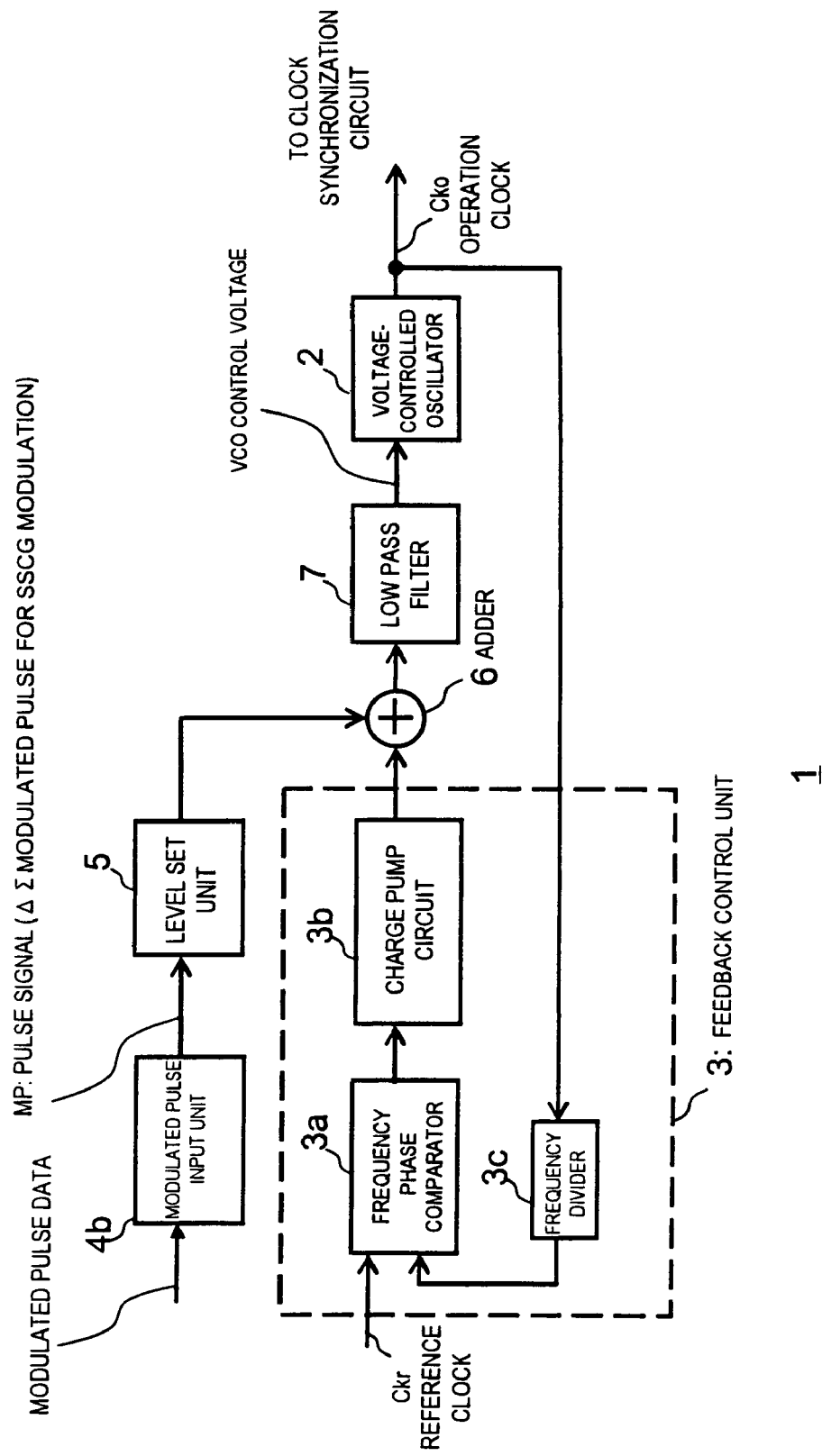
FIG. 7 illustrates a block diagram of an SSCG according to example 5 of the present invention.
Figure 8:
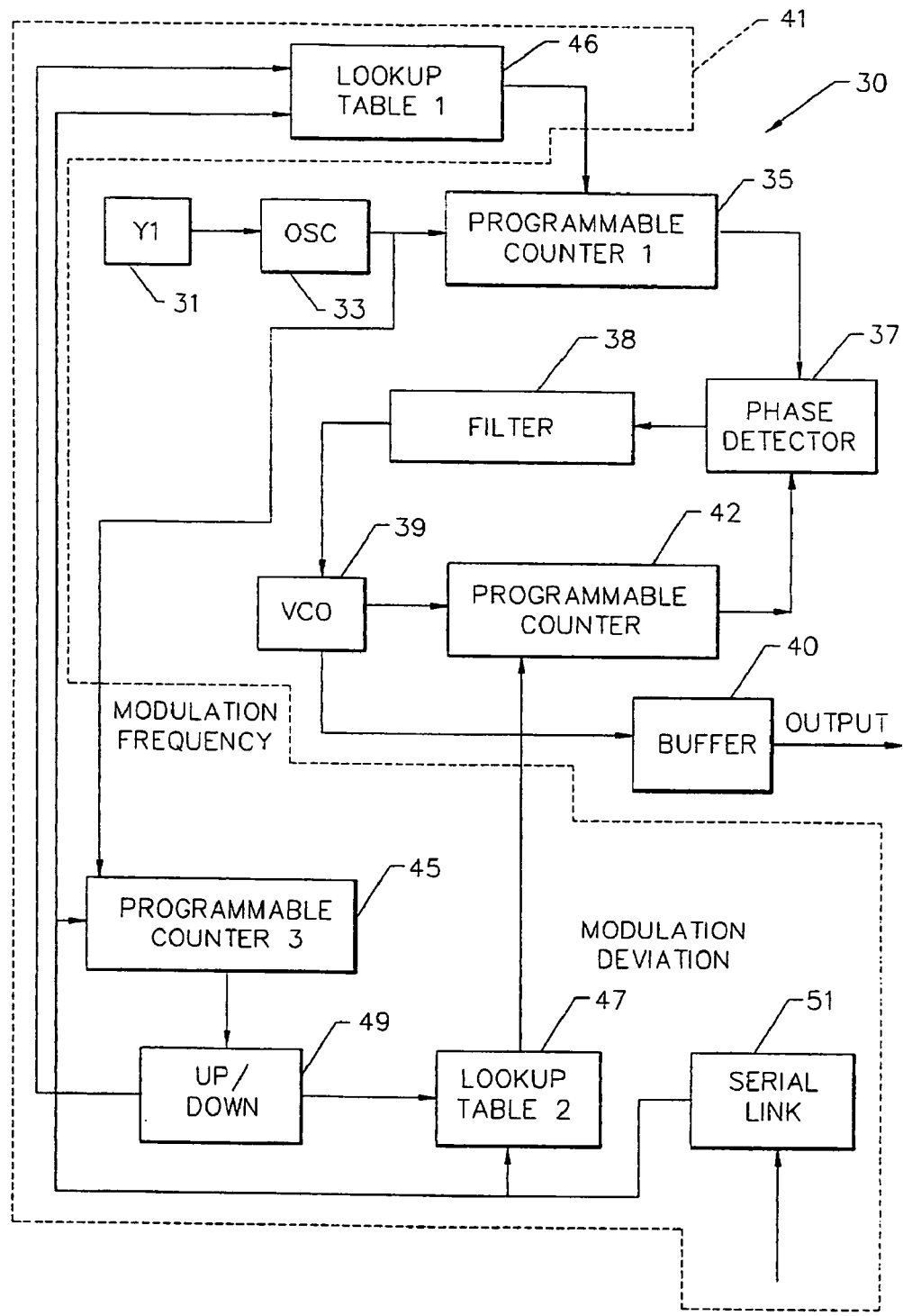
FIG. 8 illustrates a block diagram of a conventional SSCG disclosed in FIG. 6 of Patent Document 1.
Figure 9:
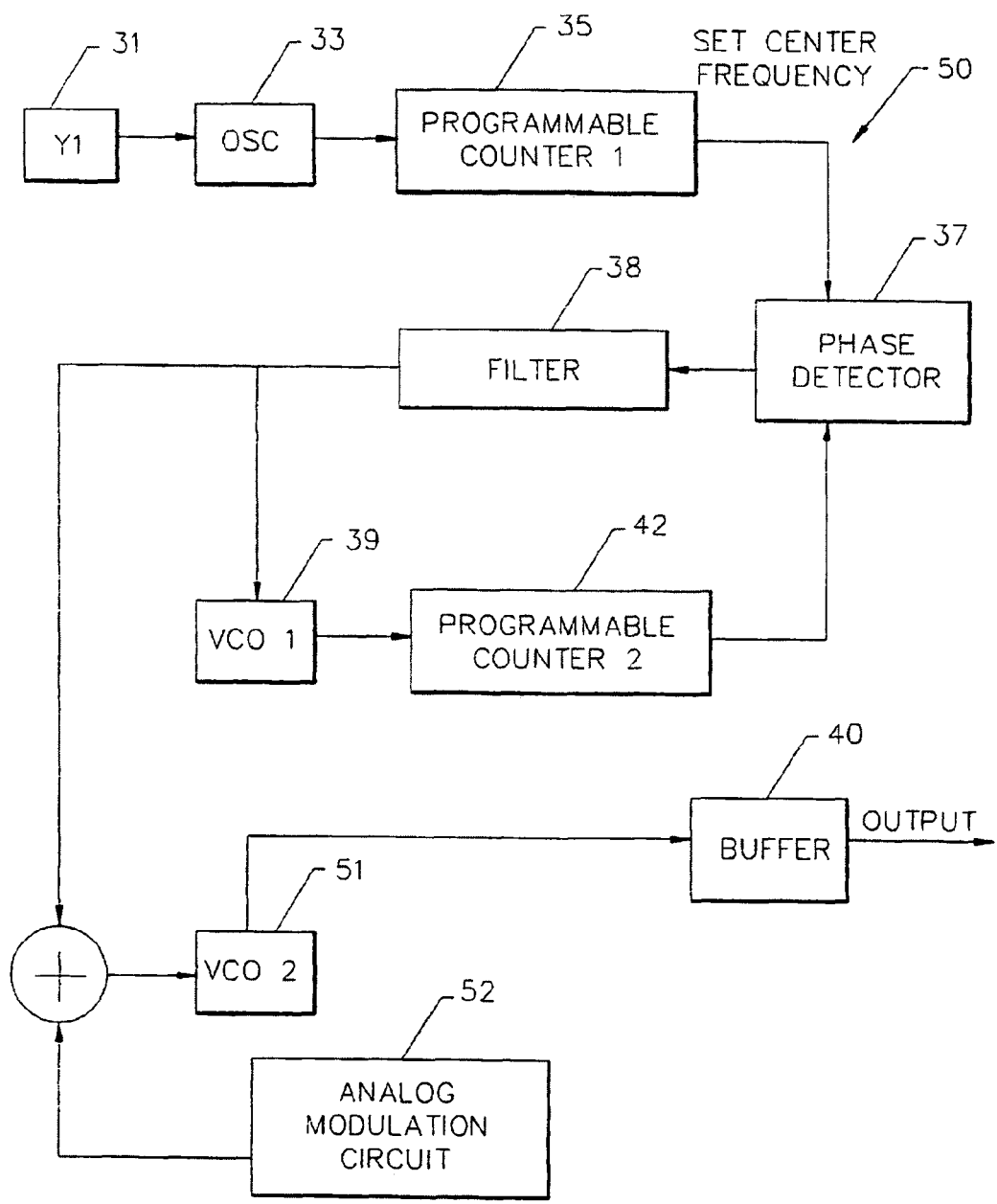
FIG. 9 illustrates a block diagram of a conventional SSCG disclosed in FIG. 7 of Patent Document 1.
Figure 10:
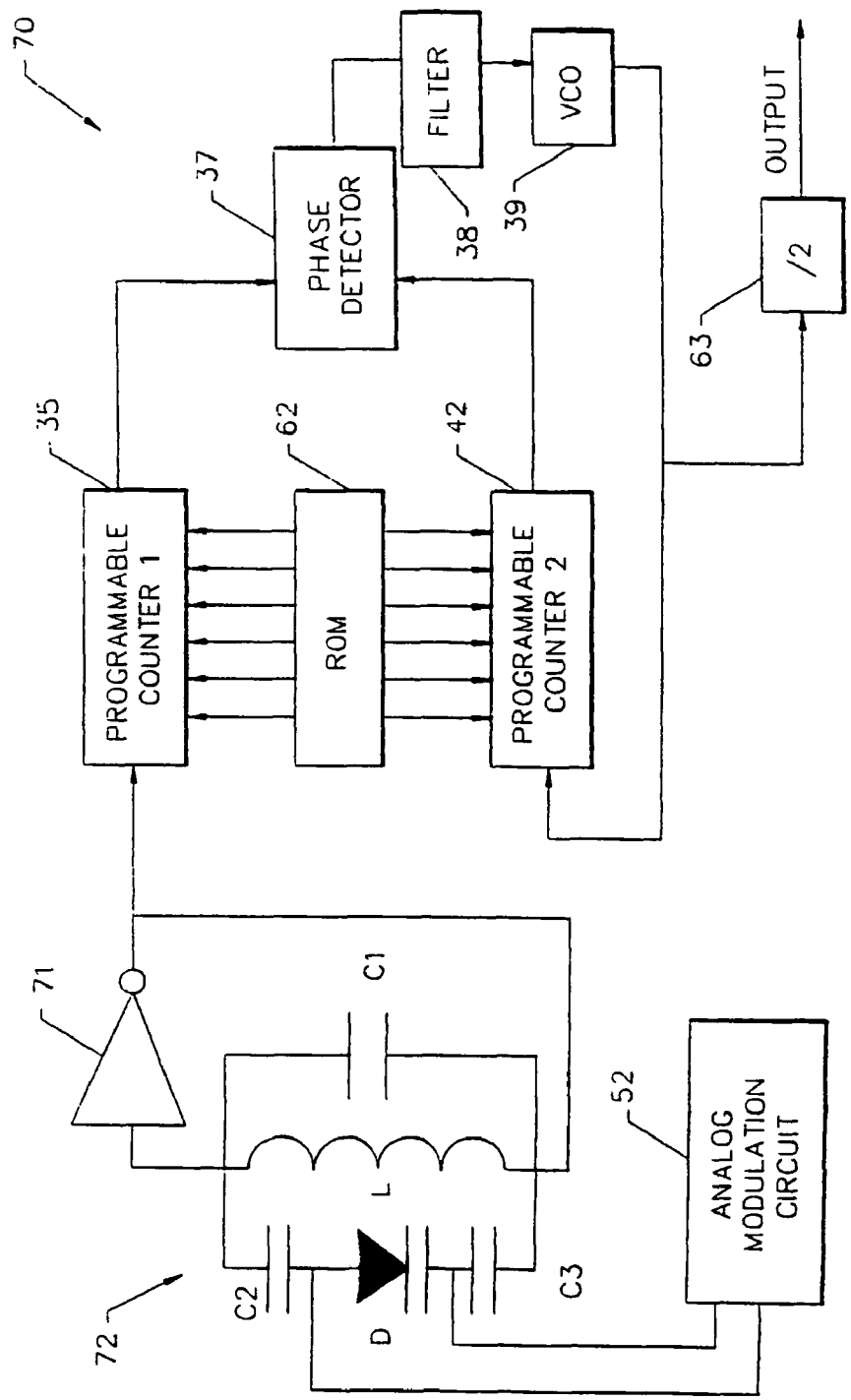
FIG. 10 illustrates a block diagram of a conventional SSCG disclosed in FIG. 8 of Patent Document 1.
Figure 11:
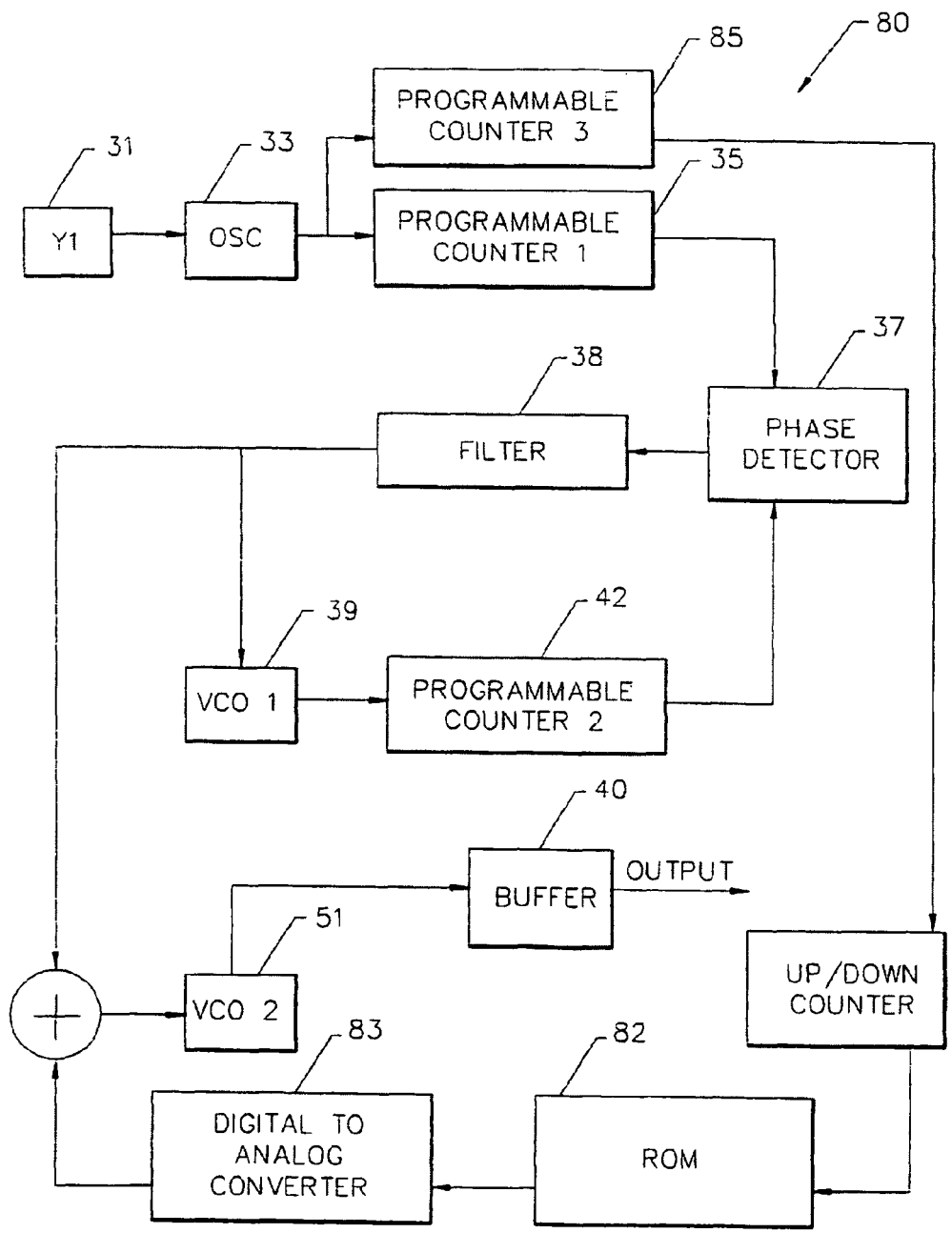
FIG. 11 illustrates a block diagram of a conventional SSCG disclosed in FIG. 9 of Patent Document 1.

Furthermore, as illustrated in FIG. 7, a semiconductor device according to another exemplary embodiment of the present invention includes the SSCG 1 and a clock synchronization circuit operating in synchronization with an operation clock, wherein the SSCG includes a VCO 2 generating the operation clock, a feedback control unit 3 comparing a phase of the operation clock Cko with a phase of a reference clock Ckr, and based on results of the comparison, generating a voltage used as a reference to oscillate the VCO 2, a level set unit 5 receiving a pulse signal MP obtained by performing a delta-sigma modulation on a component fluctuating a frequency of the operation clock Cko and setting an amplitude of the pulse signal, an adder 6 adding a voltage generated by the feedback control unit 3 and the pulse signal whose amplitude is set by the level set unit 5, and a low pass filter 7 filtering a signal outputted from the adder 6 and generating a control voltage applied to the VCO 2. Namely, while not particularly illustrated, the operation clock generated by the clock generator 1 arranged in a semiconductor device is supplied as an operation clock in an internal circuit of the semiconductor device, and at least part of the internal circuit operates in synchronization with the operation clock. The delta-sigma-modulated pulse signal may be generated in the semiconductor device. Alternatively, as illustrated in FIG. 7, by arranging a modulated pulse input unit 4b, a modulated pulse or modulated pulse data may be inputted from the outside. Examples of the present invention will be hereinafter described in detail with reference to the accompanying drawings.

Example 1

FIG. 1 illustrates a block diagram of an SSCG 1 according to example 1. In FIG. 1, a VCO 2, a feedback control unit 3, and a low pass filter 7 form a general PLL circuit. The feedback control unit 3 includes a frequency phase comparator 3a, a charge pump circuit 3b, and a frequency divider 3c. The frequency divider 3c divides an operation clock Cko, and the obtained signal is compared with a reference clock Ckr by the frequency phase comparator 3a. The frequency phase comparator 3a compares the frequency or phase of these received signals, and based on results of the comparison, controls the charge pump circuit 3b to output a pulse. The low pass filter 7 smoothes this pulse to generate a control voltage applied to the VCO 2. Since the oscillation frequency of the VCO 2 is controlled by the control voltage, the operation clock Cko synchronizes with the reference clock Ckr and has a frequency higher by a multiple of a frequency division ratio of the frequency divider 3c. Based on this PLL circuit formed by the VCO 2, the feedback control unit 3, and the low pass filter 7, once the frequency phase of the reference clock Ckr and that of the operation clock Cko are synchronized with each other, the operation clock Cko stably oscillates at a certain frequency and is maintained unless setting conditions are changed from the outside.

A modulated pulse generation unit 4, a level set unit 5, and an adder 6 are used to fluctuate the oscillation frequency of the operation clock Cko oscillating in the PLL circuit, so that the frequency spectrum is spread. The modulated pulse generation unit 4 generates a pulse signal MP, which is a signal obtained by performing a delta sigma modulation on a voltage component fluctuating the oscillation frequency in the PLL circuit. The pulse wave outputted as the pulse signal MP is demodulated by the low pass filter 7 into a voltage fluctuation of the control voltage applied to the VCO 2. Then a frequency of the operation clock Cko is fluctuated. The level set unit 5 sets the amplitude of the pulse generated by the modulated pulse generation unit 4. Based on the amplitude set by the level set unit 5, the magnitude of the fluctuation applied to the oscillation frequency of the operation clock Cko can be set. The adder 6 adds a voltage generated by the feedback control unit 3 (charge pump circuit 3b) and the pulse signal whose amplitude is set by the level set unit 5. The low pass filter 7 smoothes the voltage signal generated by the addition carried out by the adder 6, to generate the control voltage applied to the VCO 2.

Figure 2A:
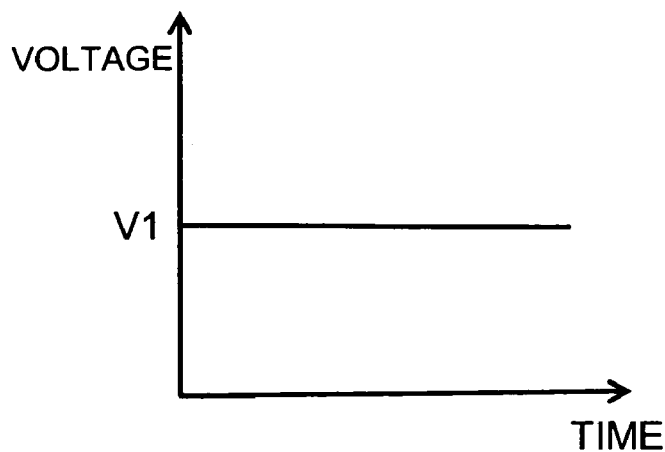
FIG. 2A illustrates a voltage waveform obtained by integrating a voltage outputted from a charge pump circuit with a low pass filter when a PLL according to example 1 is locked.

Next, the control voltage applied to the VCO 2 will be described with reference to FIG. 2. FIG. 2A illustrates a voltage waveform obtained by integrating a voltage outputted from the charge pump circuit 3b with the low pass filter 7 when the PLL is locked. In FIG. 2A, the voltage from the level set unit 5 is 0, and the voltage outputted from the charge pump circuit 3b is directly supplied to the low pass filter 7. When the PLL circuit formed by the VCO 2, the feedback control unit 3, and the low pass filter 7 is locked, the voltage outputted from the charge pump circuit 3b is stable, and the low pass filter 7 outputs a certain fixed-level control voltage to the VCO 2.

Figure 2B:
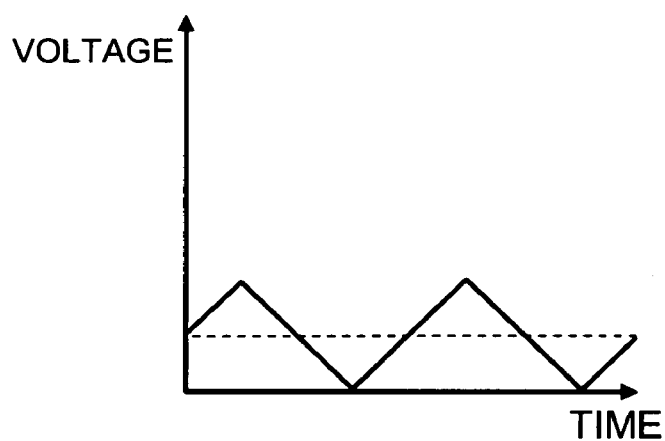
FIG. 2B illustrates a voltage waveform obtained by integrating a signal outputted from a level set unit with the low pass filter according to example 1.

FIG. 2B illustrates a voltage waveform obtained by integrating only a signal outputted from the level set unit 5 with the low pass filter 7. The voltage waveform is indicated by a bold solid line, and the average of the voltage is indicated by a dashed line. The modulated pulse generation unit 4 outputs a delta-sigma-modulated pulse waveform, so that an ideal voltage waveform can be obtained when the low pass filter 7 integrates the signal with a predetermined time constant. Thus, after the pulse waveform is demodulated by passing through the low pass filter 7, an ideal voltage waveform is obtained. While the voltage waveform illustrated in FIG. 2B is a simple triangular waveform, by changing the setting of the pulse outputted from the modulated pulse generation unit 4, an arbitrary voltage waveform can be obtained. Further, while the voltage waveform is determined by the pulse waveform outputted from the modulated pulse generation unit 4, the amplitude of the waveform is set by the level set unit 5, and the amplitude of the voltage waveform outputted from the low pass filter 7 is accordingly determined.

Generally, the pulse outputted from the modulated pulse generation unit 4 is a pulse density modulation (PDM) signal.

Figure 2C:
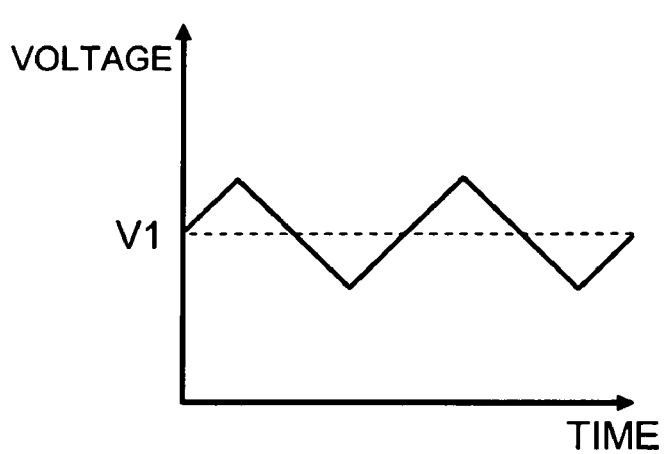
FIG. 2C illustrates a voltage waveform obtained by adding the voltage outputted from the charge pump circuit and the signal outputted from the level set unit with an adder and integrating the obtained signal with the low pass filter according to example 1.

FIG. 2C illustrates a voltage waveform obtained by adding the voltage outputted from the charge pump circuit 3b and the signal outputted from the level set unit 5 with the adder 6 and integrating the obtained signal with the low pass filter 7. Namely, if the voltage waveform of FIG. 2A, which is obtained by integrating the voltage outputted from the charge pump circuit 3b with the low pass filter 7, and the voltage waveform of FIG. 2B, which is obtained by integrating the voltage outputted from the level set unit 5 with the low pass filter 7, are simply added to each other, the obtained waveform is substantially equal to the voltage waveform of FIG. 2C. In FIG. 2C, the average of the voltage is equal to an average V1 of the voltage outputted from the charge pump circuit 3b. Thus, while the frequency changes depending on the voltage supplied from the level set unit 5, the average of the frequency remains the same as that obtained when modulation is not executed via the level set unit 5.

Figure 3A:
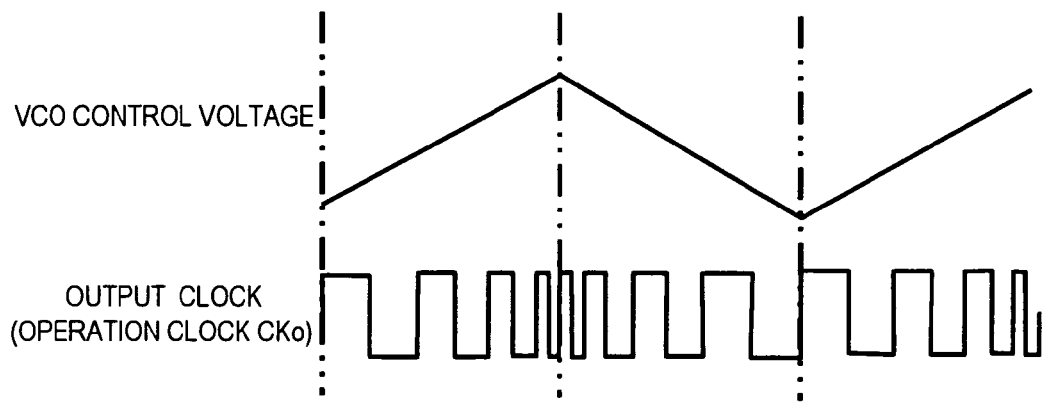
FIG. 3A schematically illustrates a relationship between a VCO control voltage and the frequency of an operation clock signal according to example 1.

FIG. 3A schematically illustrates a relationship between the VCO control voltage and a frequency of the operation clock signal in example 1. When the VCO control voltage is changed depending on the voltage outputted from the level set unit 5, the oscillation frequency of the operation clock Cko outputted from the VCO 2 is accordingly changed. As illustrated in FIG. 3A, the higher the VCO control voltage, the higher the oscillation frequency of the operation clock Cko, and the lower the VCO control voltage, the lower the oscillation frequency of the operation clock Cko.

Figure 3B:
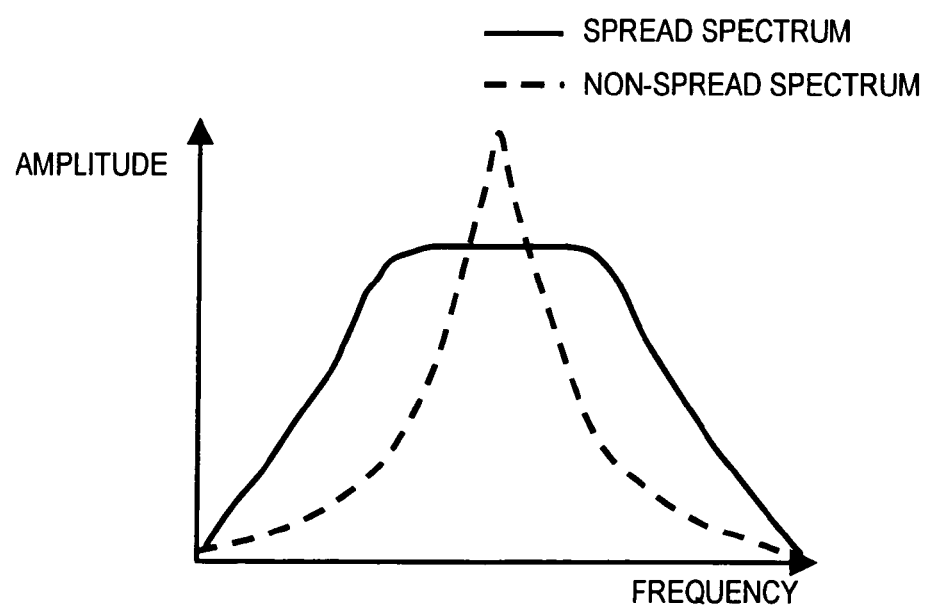
FIG. 3B illustrates a spread frequency spectrum and a non-spread frequency spectrum.

FIG. 3B illustrates profiles of a spread frequency spectrum and a non-spread frequency spectrum. A dashed line indicates a non-spread frequency spectrum and a solid line indicates a spread frequency spectrum. While the non-spread spectrum has a peak at a certain frequency, the spread spectrum has a suppressed and flattened peak.

Example 2

FIG. 4 illustrates a block diagram of an SSCG 1 according to example 2. In FIG. 4, elements substantially identical to those in FIG. 1 according to example 1 are denoted by the identical reference characters, and the descriptions thereof will be omitted. In FIG. 4, the modulated pulse generation unit 4 of FIG. 1 is replaced with a modulated pulse storage circuit 4a. Other aspects of the SSCG 1 of FIG. 4 according to example 2 are the same as the SSCG 1 of FIG. 1 according to example 1. The modulated pulse storage circuit 4a stores a modulated pulse prepared in advance. If the center frequency of the operation clock Cko and the frequency spectrum to be spread are determined in advance, a voltage waveform applied to the VCO 2 is determined so that the frequency spectrum can be obtained. Next, based on the voltage waveform, in view of filter characteristics of the low pass filter 7, a delta-sigma-modulated pulse waveform inputted to the low pass filter 7 can be calculated. It is thus only necessary to store the calculated pulse waveform in the modulated pulse storage circuit 4a. For example, the modulated pulse storage circuit 4a can be realized by using a ROM. More specifically, an output pulse train may be stored in each address of a ROM, and the addresses may be sequentially updated to read the pulse train, so as to generate a desired modulated pulse train.

Alternatively, instead of such ROM, a flash memory or a random access memory (RAM) may be used as the modulated pulse storage circuit 4a. If a flash memory or a RAM is used, even after a semiconductor device including the SSCG is manufactured, the modulated pulse can be changed.

Example 3

FIG. 5 is a block diagram illustrating an SSCG 1 according to example 3. The SSCG 1 illustrated in FIG. 5 further includes, assuming that the low pass filter 7 of example 1 is a first low pass filter 7, a second low pass filter 8 that filters the pulse signal MP whose amplitude is set by the level set unit 5. Based on the SSCG 1 according to example 3, the adder 6 adds the voltage generated by the feedback control unit 3 and the pulse signal filtered by the second low pass filter 8. Based on this configuration according to example 3, it is possible to change frequency characteristics of the second low pass filter 8 that demodulates the delta-sigma-modulated signal and those of the first low pass filter 7 arranged on the output side of the charge pump circuit 3b. Namely, the cutoff frequency of the delta-sigma-modulated signal and that of the signal outputted from the charge pump 3b can be made different.

Example 4

FIG. 6 is a block diagram illustrating an SSCG 1 according to example 4. The SSCG 1 of FIG. 6 is a combination of the SSCGs according to examples 2 and 3. Namely, when FIG. 6 is compared with FIG. 1 (example 1), the modulated pulse storage circuit 4a of example 2 is used as the modulated pulse generation unit 4. In addition, as in the example 3, the second low pass filter 8 is arranged between the level set unit 5 and the adder 6. Based on this configuration, by using the modulated pulse storage circuit 4a, a delta-sigma-modulated pulse can be obtained easily, and frequency characteristics of the low pass filter 8 that demodulates the delta-sigma-modulated pulse signal and those of the low pass filter 7 that smoothes the signal outputted from the charge pump circuit 3b can be made different.

Example 5

FIG. 7 is a block diagram illustrating an SSCG 1 particularly suitably used when formed on a semiconductor chip. In FIG. 7, the modulated pulse generation unit 4 of example 1 is not arranged on a semiconductor chip. However, a modulated pulse input unit 4b is arranged so that a delta-sigma-modulated signal is supplied from the outside of the semiconductor chip. Thus, while the SSCG 1 of FIG. 7 does not include the modulated pulse generation unit 4, since the clock generator 1 can receive a delta-sigma-modulated pulse from the outside, the operation clock Cko having a spread spectrum can be obtained. When the SSCG 1 is built in a semiconductor device, by supplying the operation clock Cko generated by the clock generator 1 to at least part of a circuit of the semiconductor device and synchronizing the circuit with the operation clock Cko, the semiconductor device can be operated. Further, needless to say, the SSCG 1 according to any one of examples 1 to 4, including the modulated pulse generation unit 4 or the modulated pulse storage circuit 4a, may be arranged on a semiconductor chip.

In the present disclosure, various modes are possible which includes the following, but not restrictive thereto.

(Mode 1): A spread spectrum clock generator as set forth as the first aspect.

(Mode 2): In the spread spectrum clock generator according to mode 1, wherein the pulse signal is obtained by performing a pulse density modulation on a component fluctuating a frequency of the operation clock.

(Mode 3): In the spread spectrum clock generator according to mode 1 or 2, further comprising, assuming that the low pass filter is a first low pass filter, a second low pass filter filtering a pulse signal whose amplitude is set by the level set unit, wherein the adder adds a voltage generated by the feedback control unit and a pulse signal filtered by the second low pass filter.

(Mode 4): In the spread spectrum clock generator according to any one of modes 1 to 3, wherein the modulated pulse generation unit comprises a storage circuit storing a previously generated pulse signal.

(Mode 5): A spread spectrum clock generator as set forth as the second aspect.

(Mode 6): In the spread spectrum clock generator according to mode 5, wherein the pulse generation unit generates a delta-sigma modulation pulse, said delta-sigma modulation pulse being demodulated by the low pass filter into a voltage fluctuation of the control voltage applied to the voltage-controlled oscillator.

(Mode 7): In the spread spectrum clock generator according to mode 5, wherein the pulse generation unit generates a pulse density modulation pulse, said pulse density modulation pulse being demodulated by the low pass filter into a voltage fluctuation of the control voltage applied to the voltage-controlled oscillator.

(Mode 8): In the spread spectrum clock generator according to any one of modes 5 to 7, further comprising, assuming that the low pass filter is a first low pass filter, a second low pass filter filtering a pulse signal whose amplitude is set by the level set unit, wherein the adder adds a voltage generated by the feedback control unit and a pulse signal filtered by the second low pass filter.

(Mode 9): In the spread spectrum clock generator according to any one of modes 5 to 8, wherein the pulse generation unit comprises a storage circuit storing a previously generated pulse signal.

(Mode 10): A semiconductor device as set forth as the third aspect.

(Mode 11): In the semiconductor device according to mode 10, further comprising a modulated pulse generation unit generating a pulse signal inputted to the level set unit.

(Mode 12): In the semiconductor device according to mode 11, wherein the modulated pulse generation unit comprises a storage circuit storing a previously generated pulse signal.

(Mode 13): In the semiconductor device according to any one of modes 10 to 12, further comprising, assuming that the low pass filter is a first low pass filter, a second low pass filter filtering a pulse signal whose amplitude is set by the level set unit, wherein the adder adds a voltage generated by the feedback control unit and a pulse signal filtered by the second low pass filter.

While the present invention has thus been described based on examples, the present invention is not limited to the above examples. Needless to say, the present invention includes various variations and modifications that could be made by those skilled in the art within the scope of the present invention.

What is claimed is:

1. A spread spectrum clock generator comprising:
a voltage-controlled oscillator that generates an operation clock;
a feedback control unit that compares a phase of the operation clock with a phase of a reference clock and, based on a result of the comparison, generates a voltage used as a reference to oscillate the voltage-controlled oscillator;
a modulated pulse generation unit that generates a pulse signal obtained by performing a delta-sigma modulation on a component that fluctuates at a frequency of the operation clock;
a level set unit that sets an amplitude of the pulse signal;
an adder that adds the voltage generated by the feedback control unit and the pulse signal whose amplitude is set by the level set unit; and
a low pass filter that filters a signal outputted from the adder and generates a control voltage applied to the voltage-controlled oscillator.

2. The spread spectrum clock generator according to claim 1, wherein the pulse signal is obtained by performing a pulse density modulation on the component that fluctuates at the frequency of the operation clock.

3. The spread spectrum clock generator according to claim 1, wherein the plow pass filter comprises a first low pass filter, and the spread spectrum clock generator further comprises a second low pass filter that filters the pulse signal whose amplitude is set by the level set unit,
wherein the adder adds the voltage generated by the feedback control unit and the pulse signal filtered by the second low pass filter.

4. The spread spectrum clock generator according to claim 1, wherein the modulated pulse generation unit comprises a storage circuit that stores a previously generated pulse signal.

5. The spread spectrum clock generator according to claim 3, wherein the modulated pulse generation unit comprises a storage circuit that stores a previously generated pulse signal.

6. A circuit comprising:
a voltage-controlled oscillator (VCO) configured to generate clock signal based on a control voltage;
a feedback control unit configured to compare a phase of the clock signal with a phase of a reference clock signal to generate the control voltage based on results of the comparison;
a pulse generation unit configured to generate a pulse signal modulated with a pulse density modulation;
a level set unit configured to set an amplitude of the pulse signal; and
an adder configured to add the pulse signal whose amplitude is set by the level set unit to the control voltage.

7. The circuit according to claim 6, further comprising a low pass filter coupled between the adder and the VCO, wherein the pulse generation unit is configured to generate a delta-sigma modulation pulse, said delta-sigma modulation pulse being demodulated with the low pass filter.

8. The circuit according to claim 6, wherein the circuit is configured to generate the clock signal having a frequency corresponding to the control voltage, and
wherein the frequency of the clock signal is fluctuated based on the pulse signal generated by the pulse generation unit.

9. The circuit according to claim 6, further comprising a first low pass filter and a second low pass filter filtering the pulse signal whose amplitude is set by the level set unit,
wherein the adder adds a voltage generated by the feedback control unit and a pulse signal filtered by the second low pass filter.

10. The circuit according to claim 6, wherein the pulse generation unit includes a storage circuit configured to store a previously generated pulse signal.

11. The circuit according to claim 9, wherein the pulse generation unit includes a storage circuit configured to store a previously generated pulse signal.

12. A semiconductor device comprising:
a spread spectrum clock generator; and
a clock synchronization circuit that operates in synchronization with an operation clock,
wherein the spread spectrum clock generator comprises:
a voltage-controlled oscillator that generates the operation clock;
a feedback control unit that compares a phase of the operation clock with a phase of a reference clock and, based on results of the comparison, generates a voltage used as a reference to oscillate the voltage-controlled oscillator;
a level set unit that receives a pulse signal obtained by performing a delta-sigma modulation on a component that fluctuates at a frequency of the operation clock and setting sets an amplitude of the pulse signal;
an adder that adds the voltage generated by the feedback control unit and the pulse signal whose amplitude is set by the level set unit; and
a low pass filter that filters a signal outputted from the adder and generates a control voltage applied to the voltage-controlled oscillator.

13. The semiconductor device according to claim 12, further comprising a modulated pulse generation unit that generates the pulse signal inputted to the level set unit.

14. The semiconductor device according to claim 13, wherein the modulated pulse generation unit comprises a storage circuit that stores a previously generated pulse signal.

15. The semiconductor device according to claim 12, wherein the low pass filter comprises a first low pass filter, and the spread spectrum clock generator further comprises a second low pass filter that filters the pulse signal whose amplitude is set by the level set unit,
wherein the adder adds the voltage generated by the feedback control unit and the pulse signal filtered by the second low pass filter.

16. The semiconductor device according to claim 14, wherein the low pass filter comprises a first low pass filter, and the spread spectrum clock generator further comprises a second low pass filter that filters the pulse signal whose amplitude is set by the level set unit,
wherein the adder adds the voltage generated by the feedback control unit and the pulse signal filtered by the second low pass filter.

17. The spread spectrum clock generator according to claim 1, wherein the feedback control unit comprises a frequency divider that receives the operation clock, and the frequency of the operation clock is higher than a frequency of the reference clock by a multiple of a frequency division ratio of the frequency divider.

18. The spread spectrum clock generator according to claim 1, wherein the operation clock synchronizes with the reference clock.

19. The spread spectrum clock generator according to claim 1, wherein the voltage generated by the feedback control unit comprises a plurality of amplitudes including a highest amplitude and a lowest amplitude, and
wherein, when the voltage is at the highest amplitude, the operation clock operates at a higher frequency than when the voltage is at the lowest amplitude.

20. The spread spectrum clock generator according to claim 1, wherein the feedback control unit comprises:
a frequency divider that receives the operation clock;
a frequency phase comparator that receives the reference clock and a signal outputted by the frequency divider; and
a charge pump circuit that receives a signal outputted by the frequency phase comparator and generates the voltage used as the reference to oscillate the voltage-controlled oscillator.

* * * * *